United States Patent
Blain et al.

(10) Patent No.: US 12,076,805 B2
(45) Date of Patent: Sep. 3, 2024

(54) BUILDING LIQUID FLOW-THROUGH PLATES

(71) Applicant: RAYTHEON COMPANY, Waltham, MA (US)

(72) Inventors: Trae M. Blain, Plano, TX (US); James S. Wilson, Hurst, TX (US)

(73) Assignee: RAYTHEON COMPANY, Waltham, MA (US)

( * ) Notice: Subject to any disclaimer, the term of this patent is extended or adjusted under 35 U.S.C. 154(b) by 524 days.

(21) Appl. No.: 17/103,368

(22) Filed: Nov. 24, 2020

(65) Prior Publication Data

US 2022/0161343 A1 May 26, 2022

(51) Int. Cl.
| | |
|---|---|
| *B23K 1/00* | (2006.01) |
| *C23C 14/16* | (2006.01) |
| *C25D 5/02* | (2006.01) |
| *H05K 7/20* | (2006.01) |
| *C25D 5/50* | (2006.01) |

(52) U.S. Cl.
CPC .......... *B23K 1/0012* (2013.01); *B23K 1/0008* (2013.01); *C23C 14/16* (2013.01); *C25D 5/02* (2013.01); *H05K 7/2039* (2013.01); *C25D 5/50* (2013.01)

(58) Field of Classification Search
CPC .............. B23K 20/023; B23K 2101/18; B23K 2103/10; B23K 35/0238; B23K 35/001
See application file for complete search history.

(56) References Cited

U.S. PATENT DOCUMENTS

| | | | | |
|---|---|---|---|---|
| 2,996,401 | A * | 8/1961 | Welch | C04B 41/88 65/60.2 |
| 3,197,290 | A * | 7/1965 | Williams | C04B 41/009 428/656 |
| 4,411,380 | A | 10/1983 | McWithey et al. | |
| 4,526,859 | A * | 7/1985 | Christensen | H01L 21/4846 427/259 |
| 5,410,133 | A * | 4/1995 | Matsen | B21D 26/055 428/293.1 |
| 5,706,999 | A * | 1/1998 | Lim | C22C 32/0063 427/376.6 |
| 6,190,133 | B1 * | 2/2001 | Ress, Jr. | F01D 5/28 416/241 R |
| 6,455,804 | B1 * | 9/2002 | Gordon | C22C 21/02 219/121.64 |

(Continued)

FOREIGN PATENT DOCUMENTS

EP          3276657 A1    1/2018

OTHER PUBLICATIONS

JP-2006062930-A computer english translation (Year: 2023).*

(Continued)

*Primary Examiner* — Erin B Saad
(74) *Attorney, Agent, or Firm* — CANTOR COLBURN LLP

(57) ABSTRACT

A process for building a high-performance liquid flow-through plate is provided and includes providing a substrate formed of metal matrix composite (MMC) material, metallizing a surface of the substrate to reform the surface into a metallized surface, placing a braze foil on the metallized surface and executing a high-temperature and high-pressure bake whereby material of the braze foil diffuses into the metallized surface.

10 Claims, 4 Drawing Sheets

(56) References Cited

U.S. PATENT DOCUMENTS

| | | | |
|---|---|---|---|
| 6,952,345 B2 | 10/2005 | Weber et al. | |
| 7,874,518 B2* | 1/2011 | Pham | B64C 1/12 |
| | | | 244/132 |
| 2002/0130161 A1* | 9/2002 | Schmitt | B23K 35/001 |
| | | | 228/208 |
| 2004/0142202 A1* | 7/2004 | Kinoshita | B32B 3/266 |
| | | | 428/609 |
| 2005/0101082 A1* | 5/2005 | Yokoyama | C23C 16/4581 |
| | | | 438/232 |
| 2006/0107516 A1 | 5/2006 | Joseph et al. | |
| 2019/0177231 A1* | 6/2019 | Huang | C25D 5/48 |

OTHER PUBLICATIONS

Dan Kay, Industrial Heating, https://www.industrialheating.com/blogs, Jan. 7, 2010 (Year: 2010).*

International Search Report and Written Opinion issued in International Application No. PCT/US2021/057988; Application Filing Date Nov. 4, 2021; Date of Mailing Mar. 4, 2022 (12 pages).

* cited by examiner

BUILDING LIQUID FLOW-THROUGH PLATES

BACKGROUND

The present disclosure relates to electronic devices and, in particular, to processes for building high-performance liquid flow-through plates for use with electronic devices.

Electronic device packages with liquid-cooled cold plates typically include an electronic device layer, a liquid-cooled cold plate and multiple material interfaces between the electronic device layer and the liquid-cooled cold plate. This is because there is often a coefficient of thermal expansion (CTE) difference between the electronic device layer and the liquid-cooled cold plate whereby the multiple material interfaces serve to gradually account for the CTE difference. It has been seen, however, that an additional temperature rise can be generated at each of the multiple material interfaces.

SUMMARY

According to an aspect of the disclosure, a process for building a high-performance liquid flow-through plate is provided. The process includes providing a substrate formed of metal matrix composite (MMC) material, metallizing a surface of the substrate to reform the surface into a metallized surface, placing a braze foil on the metallized surface and executing a high-temperature and high-pressure bake whereby material of the braze foil diffuses into the metallized surface.

In accordance with additional or alternative embodiments, the metallizing includes one of physical vapor deposition (PVD) and electroplating.

In accordance with additional or alternative embodiments, the MMC material has a relatively high porosity and the metallizing includes electroplating.

In accordance with additional or alternative embodiments, the MMC material has a relatively low porosity and the metallizing includes one of physical vapor deposition (PVD) and electroplating.

In accordance with additional or alternative embodiments, the metallized surface has a sub-micron depth.

In accordance with additional or alternative embodiments, the braze foil includes aluminum.

In accordance with additional or alternative embodiments, the executing of the high-temperature and high-pressure bake causes a transient liquid-phase bonding between the material of the braze foil and the metallized surface.

In accordance with additional or alternative embodiments, the process further includes forming a trench in the substrate, wherein the metallizing of the surface of the substrate includes metallizing surfaces of the trench, placing a conductor in the trench and interposing a fin between the braze foil and the conductor.

According to an aspect of the disclosure, a process for building a high-performance liquid flow-through plate is provided. The process includes forming first and second substrates of metal matrix composite (MMC) material, forming a trench in the first substrate, metallizing surfaces of the first and second substrates to reform the surfaces into metallized surfaces, placing a conductor in the trench, disposing a fin on the conductor and placing a braze foil on the metallized surface of the first substrate and the fin, disposing the second substrate such that the metallized surface thereof contacts the braze foil and executing a high-temperature and high-pressure bake whereby material of the braze foil diffuses into respective portions of the metallized surfaces of the first and second substrates and whereby the fin forms braze bonds at the trench using the braze foil and the conductor.

In accordance with additional or alternative embodiments, the metallizing includes one of physical vapor deposition (PVD) and electroplating.

In accordance with additional or alternative embodiments, the MMC material has a relatively high porosity and the metallizing includes electroplating.

In accordance with additional or alternative embodiments, the MMC material has a relatively low porosity and the metallizing includes one of physical vapor deposition (PVD) and electroplating.

In accordance with additional or alternative embodiments, the metallized surfaces have sub-micron depths.

In accordance with additional or alternative embodiments, the braze foil includes aluminum.

In accordance with additional or alternative embodiments, the executing of the high-temperature and high-pressure bake causes a transient liquid-phase bonding between the material of the braze foil and the respective portions of the metallized surfaces.

In accordance with additional or alternative embodiments, the process further includes operably arranging electronic devices on a non-metallized surface of the second substrate.

In accordance with additional or alternative embodiments, the process further includes activating operations of the electronic devices and flowing coolant through the trench and along the fin.

According to an aspect of the disclosure, a high-performance liquid flow-through plate is provided and includes a first substrate having a trench formed therein and being formed of metal matrix composite (MMC) material, the first substrate including a first metallized surface, a conductor disposed in the trench, a fin disposed on the conductor and a braze foil disposed on a portion of the first metallized surface and the fin, a second substrate formed of MMC material and including a second metallized surface, a transient liquid-phase bond formed between the braze foil and the portion of the first metallized surface and between the braze foil and a corresponding portion of the second metallized surface and braze bonds formed at the trench by the fin using the braze foil and the conductor.

In accordance with additional or alternative embodiments, the first and second metallized surfaces have sub-micron depths.

In accordance with additional or alternative embodiments, the high-performance liquid flow-through plate further includes electronic devices operably arranged on a non-metallized surface of the second substrate.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be described below, processes are provided by which an electronic device layer is attached directly to a liquid-cooled cold plate and thus eliminates significant amounts of thermal rise. The processes involve the use of closely matched CTE materials, such as aluminum graphite and aluminum silicone-carbide metal matrix composites, which are also sufficiently light weight for airborne systems. The processes further involve new techniques that achieve a liquid flow-through device which is capable of direct die attachment. These new techniques include a novel combination of standard aluminum foil fin and braze alloy integrated with metal matrix composite substrates by thin and thick film coating applications and pressure assisted diffusion bonding and brazing.

Figure 1:
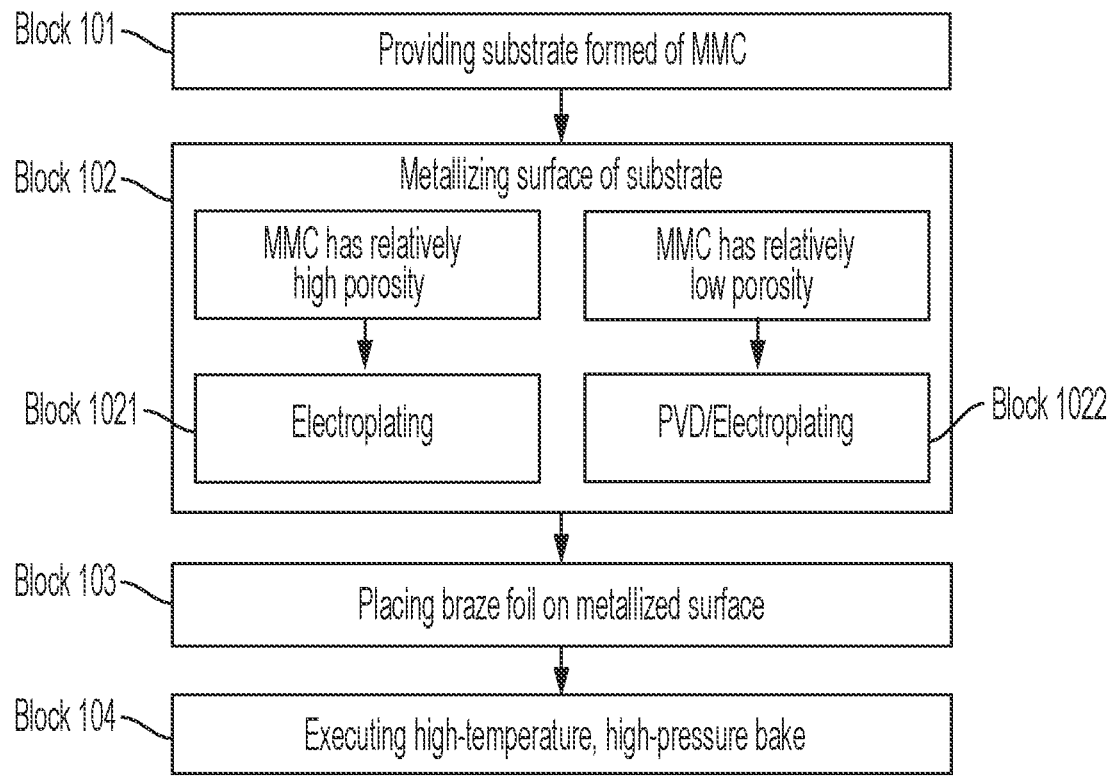
FIG. 1 is a flow diagram illustrating a process for building a high-performance liquid flow-through plate in accordance with embodiments.

With reference to FIG. 1, a process for building a high-performance liquid flow-through plate is provided. As shown in FIG. 1, the process includes providing a substrate formed of metal matrix composite (MMC) material (block 101), metallizing a surface of the substrate to reform the surface into a metallized surface (block 102), placing a braze foil, including aluminum (e.g., 4047 aluminum) or another suitable material, on the metallized surface (block 103) and executing a high-temperature and high-pressure bake (block 104) by, for example, applying about 400 psi to the braze foil and the metallized surface, whereby material of the braze foil diffuses into the metallized surface and causes a transient liquid-phase bonding between the material of the braze foil and the metallized surface.

In accordance with embodiments, the metallizing of block 102 includes a baking out of the substrate to drive moisture out of the substrate and one of physical vapor deposition (PVD) and electroplating. In particular, in cases in which the MMC material of the substrate has a relatively high porosity, the metallizing can include electroplating (block 1021). By contrast, in cases in which the MMC material of the substrate has a relatively low porosity, the metallizing can include one of physical vapor deposition (PVD) and electroplating (block 1022). In any case, although the electroplating will tend to result in a thicker metallized surface as compared to the PVD, the metallized surface resulting from the electroplating or the PVD has a sub-micron depth.

Figure 2:
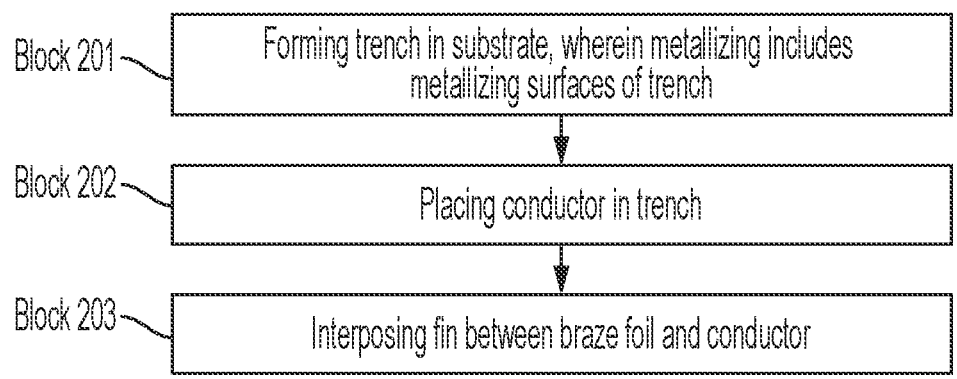
FIG. 2 is a flow diagram illustrating additional operations of the process for building the high-performance liquid flow-through plate of FIG. 1 in accordance with embodiments.

With reference to FIG. 2 and in accordance with further embodiments, the method of FIG. 1 can also include forming a trench in the substrate (block 201), wherein the metallizing of the surface of the substrate of operation 102 includes metallizing respective surfaces of the trench, placing a conductor in the trench (block 202) and interposing a fin between the braze foil and the conductor (block 203). The trench can extend between opposite sides of the substrate. The conductor can be formed of metallic material, such as braze foil material, or another suitable thermal conductor and is disposed on a bottom surface in the trench. The fin can be formed of metallic material or another suitable thermal conductor and is disposed on the conductor. The conductor and the fin can have a same length, a greater length or a lesser length than the trench.

Figure 3:
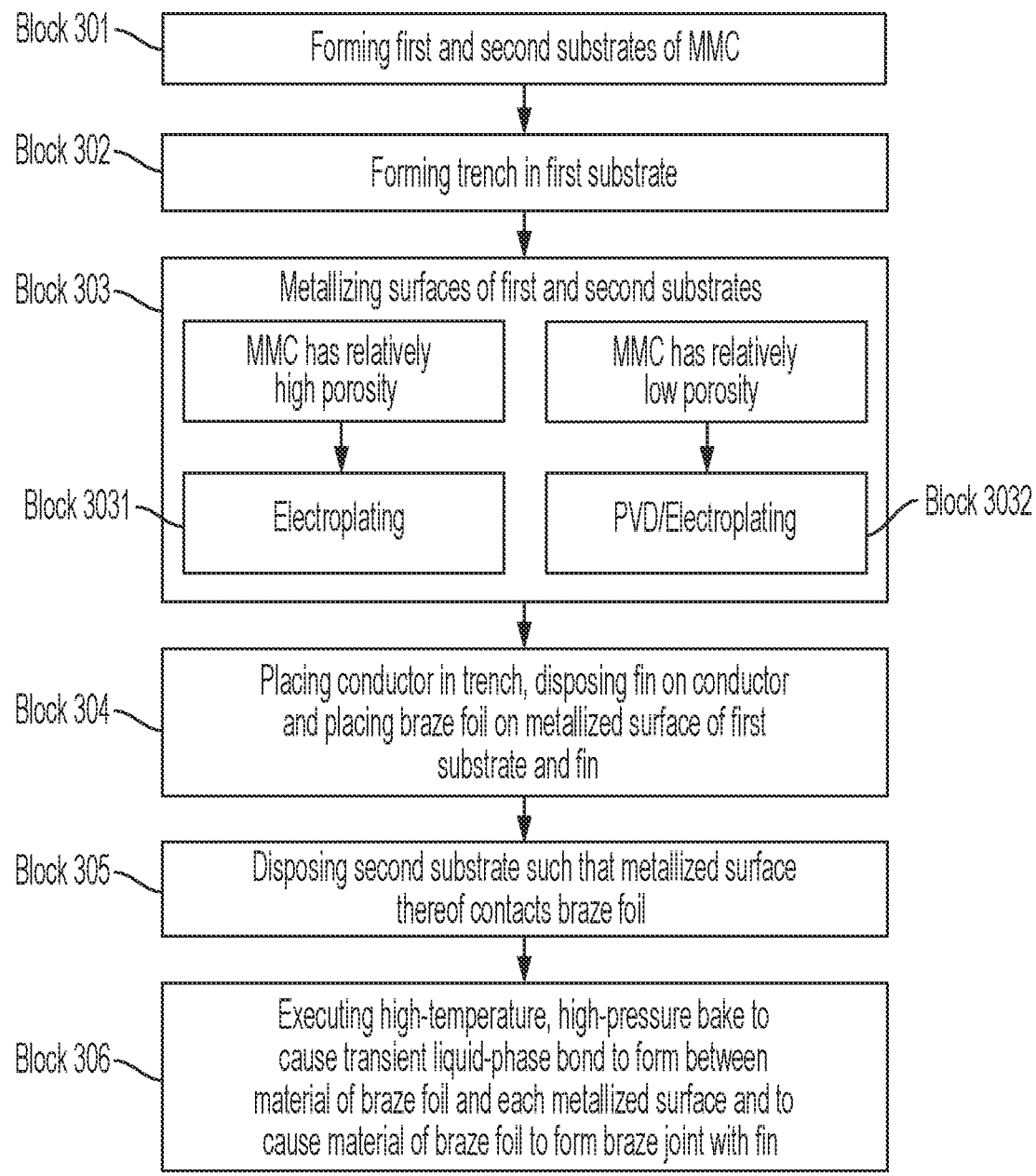
FIG. 3 is a flow diagram illustrating a process for building a high-performance liquid flow-through plate in accordance with embodiments.

With reference to FIG. 3, a process for building a high-performance liquid flow-through plate is provided. As shown in FIG. 3, the process includes forming first and second substrates of MMC material (block 301), forming a trench in the first substrate (302) and metallizing surfaces of the first and second substrates to reform the surfaces into metallized surfaces (block 303). The method can also include placing a conductor in the trench, disposing a fin on the conductor and placing braze foil, including aluminum (e.g., 4047 aluminum) or another suitable material, on the metallized surface of the first substrate and the fin (block 304). In addition, the method includes disposing the second substrate such that the metallized surface thereof contacts the braze foil (block 305) and executing a high-temperature and high-pressure bake (306) by, for example, applying about 100-500 psi or more or about 400 psi or more to the braze foil and the metallized surfaces. This causes material of the braze foil to diffuse into respective portions of each of the metallized surfaces remote from the trench and the fin and in turn causes a transient liquid-phase bond to form between the material of the braze foil and the respective portions of each of the metallized surfaces. In addition, the executing of the high-temperature and high pressure bake of operation 306 causes the fin to form braze joints with the metalized surfaces at the trench using the material of the braze foil and the material of the conductor.

In accordance with embodiments, the metallizing of block 302 includes a baking out of the first and second substrates to drive moisture out of the first and second substrates and one of physical vapor deposition (PVD) and electroplating. In particular, in cases in which the MMC material of the first and second substrates has a relatively high porosity, the metallizing can include electroplating (block 3031). By contrast, in cases in which the MMC material of the first and second substrates has a relatively low porosity, the metallizing can include one of physical vapor deposition (PVD) and electroplating (block 3032). In any case, although the electroplating will tend to result in thicker metallized surfaces as compared to the PVD, the metallized surfaces resulting from the electroplating or the PVD have sub-micron depths.

Figure 4:
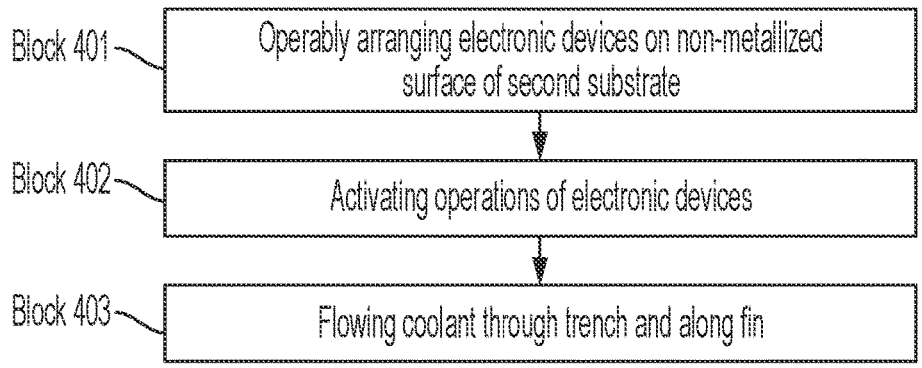
FIG. 4 is a flow diagram illustrating additional operations of the process for building the high-performance liquid flow-through plate of FIG. 3 in accordance with embodiments.

With reference to FIG. 4 and in accordance with further embodiments, the method of FIG. 3 can also include operably arranging electronic devices on a non-metallized surface of the second substrate (block 401) as well as activating operations of the electronic devices in an operational scenario (block 402) and flowing coolant through the trench and along the fin (block 403) in order to remove heat from the electronic devices.

Figure 5:
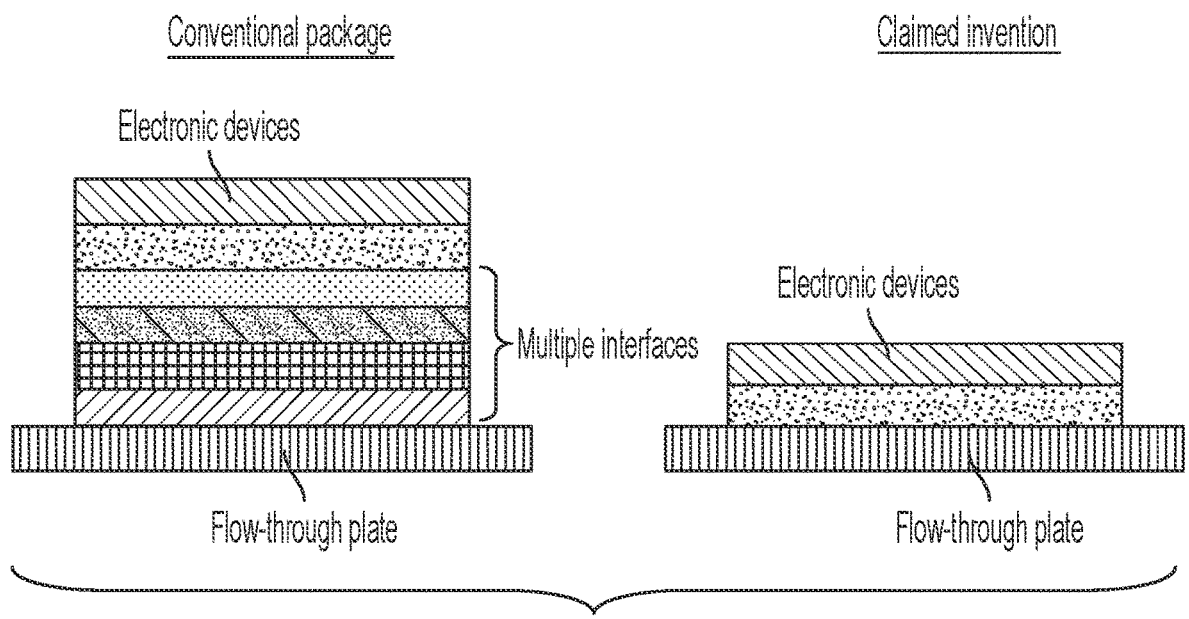
FIG. 5 is an illustrative comparison between thermal properties of conventional packages and the present disclosure in accordance with embodiments.

With reference to FIG. 5, since the electronic devices of the method of FIG. 4 are operably arranged on the non-metallized surface of the second substrate, heat transfer between the electronic devices and the coolant is more direct than in the conventional electronic device packages. That is, the heat transfer in the structures and assemblies described herein does not proceed through multiple material interfaces whereas, in conventional electronic device packages in which CTE differences have to be accounted for, the heat transfer is required to proceed through multiple material interfaces.

Figure 6:
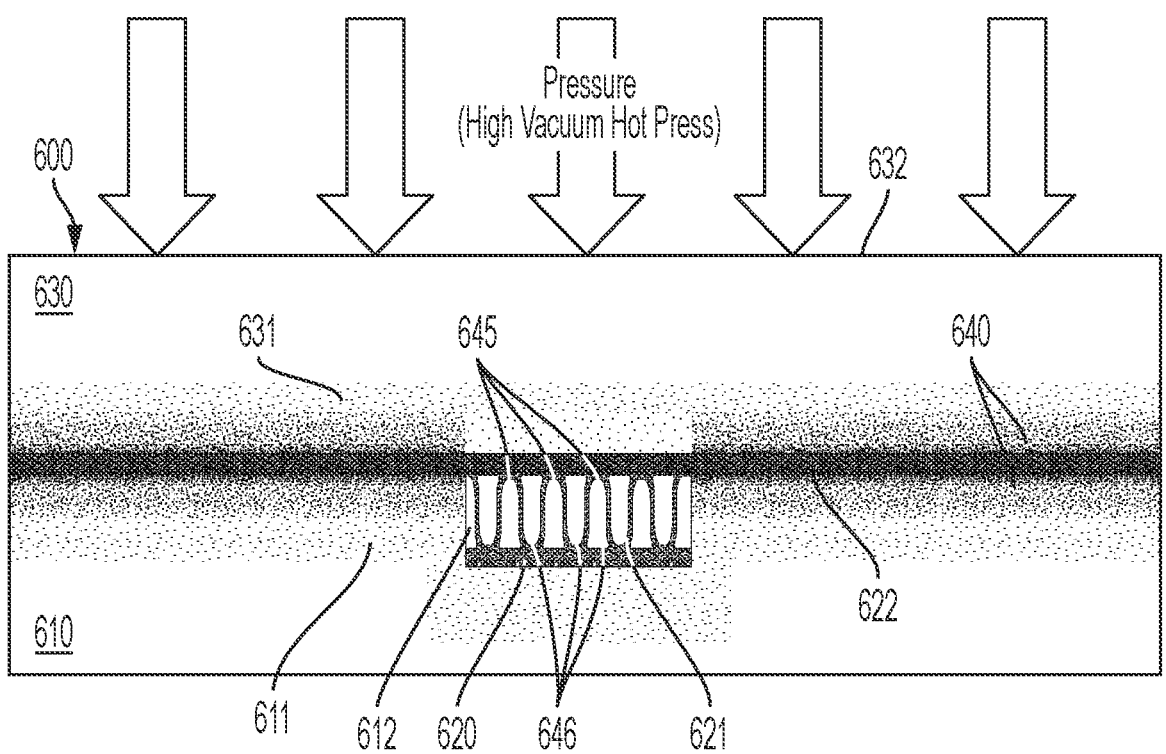
FIG. 6 is a schematic side view of a high-performance liquid flow-through plate in accordance with embodiments.
Figure 7:
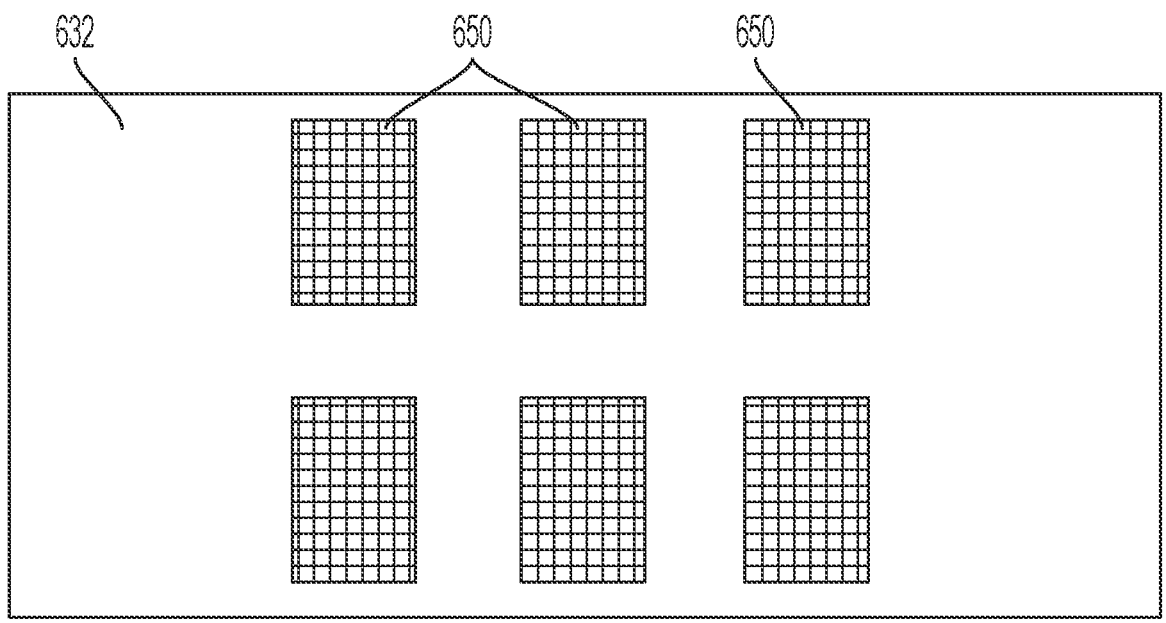
FIG. 7 is a schematic top-down view of the high-performance liquid flow-through plate of FIG. 6 in accordance with further embodiments.

With reference to FIGS. 6 and 7, a high-performance liquid flow-through plate 600 is provided. The high-performance liquid flow-through plate 600 includes a first substrate 610, a conductor 620, a fin 621, braze foil 622, a second substrate 630, a transient liquid-phase bond 640, braze bonds 645 and braze bonds 646. The first substrate 610 has aa trench 612 formed therein. The first substrate 610 is formed of MMC material and includes a first metallized surface 611. The trench 612 can extend from a first side of the first substrate 610 to a second side of the first substrate 610. The conductor 620 can be formed of metallic material, such as braze foil material, or another suitable thermal conductor and is disposed on a bottom of the trench 612. The fin 621 can be formed of metallic material or another suitable thermal conductor and is disposed on the conductor 620. The conductor 620 and the fin 621 can have a same length, a greater length or a lesser length than the trench 612. The braze foil 622 is disposed on the first metallized surface 611 and the fin 621. The second substrate 630 is formed of metal matrix composite (MMC) material and includes a second metallized surface 631 that corresponds to the first metalized surface 611 of the first substrate 610. The transient liquid-phase bond 640 is formed at an interface between a portion of the first metallized surface 611 and a corresponding portion of a first side of the braze foil 622 and at an interface between a portion of the second metallized surface 631 and a corresponding portion of a second side of the second braze foil 622. The portions of the first and second metallized surfaces 611 and 631 are defined on either side of the trench 612, the fin 621 and the conductor 622. That is, the transient liquid phase bond 640 is not present in the trench 612 or the region of the second metallized surface 631 opposite the trench 612 because of the pressure absorbing spring effect of the fin 621. The braze bonds 645 are formed at the location of the trench between the region of the second metallized surface 631 opposite the trench 612 and the fin 621 using the material of the braze foil 622 as a bonding agent. The braze bonds 646 are formed at the location of the trench 612 between the fin 621 and the proximal region of the first metallized surface 611 using the material of the conductor 620 as a bonding agent.

In accordance with embodiments, the first and second metallized surfaces 611 and 631 can each have sub-micron depths.

As shown in FIGS. 6 and 7, the high-performance liquid flow-through plate 600 can further include electronic devices 650 that are operably arranged on a non-metallized surface 632 of the second substrate 630. The non-metallized surface 632 can be, but is not required to be, opposite the second metallized surface 631. In an operational scenario, the electronic devices 650 can be activated and coolant can be flown through the trench 612 and along the fin 621 in order to remove heat from the electronic devices 650. As explained above, since the electronic devices 650 are operably arranged on the non-metallized surface 632, heat transfer between the electronic devices 650 and the coolant does not proceed through multiple material interfaces as in conventional electronic device packages.

Technical effects and benefits of the present disclosure are the provision of an electronic device package in which electronic devices are operably arranged on a cold plate through which coolant can be flown. This provides for heat removal from the electronic devices without the significant amount of thermal effects present in conventional packages.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. A process for building a high-performance liquid flow-through plate, the process comprising:
   providing a substrate formed of metal matrix composite (MMC) material;
   metallizing a surface of the substrate to reform the surface into a metallized surface;
   placing a braze foil on the metallized surface; and
   executing a bake whereby material of the braze foil diffuses into the metallized surface, the process further comprising:
   forming a trench in the substrate, wherein the metallizing of the surface of the substrate comprises metallizing surfaces of the trench;
   placing a conductor in the trench; and
   interposing a fin between the braze foil and the conductor.

2. A process for building a liquid flow-through plate, the process comprising:
   forming first and second substrates of metal matrix composite (MMC) material;
   forming a trench in the first substrate;
   metallizing surfaces of the first and second substrates to reform the surfaces into metallized surfaces;
   placing a conductor in the trench, disposing a fin on the conductor and placing a braze foil on the metallized surface of the first substrate and the fin;
   disposing the second substrate such that the metallized surface thereof contacts the braze foil; and
   executing a bake whereby material of the braze foil diffuses into respective portions of the metallized surfaces of the first and second substrates and whereby the fin forms braze bonds at the trench using the braze foil and the conductor.

3. The process according to claim 2, wherein the metallizing comprises one of physical vapor deposition (PVD) and electroplating.

4. The process according to claim 2, wherein the metallizing comprises electroplating.

5. The process according to claim 2, wherein the metallizing comprises one of physical vapor deposition (PVD) and electroplating.

6. The process according to claim 2, wherein the metallized surfaces have sub-micron depths.

7. The process according to claim 2, wherein the braze foil comprises aluminum.

8. The process according to claim 2, wherein the executing of the bake causes a transient liquid-phase bonding between the material of the braze foil and the respective portions of the metallized surfaces.

9. The process according to claim 2, further comprising operably arranging electronic devices on a non-metallized surface of the second substrate.

10. The process according to claim 9, further comprising:
   activating operations of the electronic devices; and
   flowing coolant through the trench and along the fin.

* * * * *